(12) United States Patent
Ito et al.

(10) Patent No.: US 6,609,919 B2
(45) Date of Patent: Aug. 26, 2003

(54) CARD CONNECTOR

(75) Inventors: Toshiyasu Ito, Togane (JP); Masaaki Ooya, Yokohama (JP); Seiji Shishikura, Chiba (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/090,153

(22) Filed: Mar. 5, 2002

(65) Prior Publication Data

US 2002/0132527 A1 Sep. 19, 2002

(30) Foreign Application Priority Data

Mar. 6, 2001 (JP) ........................................ 2001-062476

(51) Int. Cl.[7] .............................................. H01R 13/62

(52) U.S. Cl. .................. 439/159; 439/325; 439/331; 439/157

(58) Field of Search ................................ 439/157, 159, 439/160, 325, 331; 235/441

(56) References Cited

U.S. PATENT DOCUMENTS

| 4,810,200 | A | 3/1989 | Sakamoto | 439/155 |
|---|---|---|---|---|
| 4,952,161 | A | 8/1990 | Komatsu | 439/155 |
| 5,033,972 | A | 7/1991 | Komatsu et al. | 439/153 |
| 5,051,101 | A | 9/1991 | Komatsu | 439/159 |
| 5,145,389 | A | 9/1992 | Okubo | 439/159 |
| 5,179,505 | A | 1/1993 | Matsuo | 361/395 |
| 5,197,894 | A | 3/1993 | Koike | 439/159 |
| 5,286,207 | A | 2/1994 | McHugh | 439/159 |
| 5,492,480 | A | 2/1996 | Fusselman et al. | 439/157 |
| 5,492,481 | A | 2/1996 | Lewis | 439/157 |

(List continued on next page.)

FOREIGN PATENT DOCUMENTS

| JP | 11-316110 | 11/1999 |
|---|---|---|
| JP | 2000-251024 | 9/2000 |
| JP | 2000-251025 | 9/2000 |
| JP | 2000-277207 | 10/2000 |

OTHER PUBLICATIONS

U.S. patent application Ser. No. 09/832,190, T. Takada et al., filed Apr. 11, 2001.
U.S. patent application Ser. No. 09/914,322, S. Sato, filed Aug. 27, 2001.
U.S. patent application Ser. No. 09/978/660, S. Sato, filed Oct. 18, 2001.
U.S. patent application Ser. No. 09/978,661, S. Sato, filed Oct. 18, 2001.
U.S. patent application Ser. No. 10/067,404, M. Ooya et al., filed Feb. 07, 2002.
U.S. patent application Ser. No. 10/102,826, S. Sato et al., filed Mar. 22, 2002.
U.S. patent application Ser. No. 10/102,928, K. Abe, filed Mar. 22, 2002.

Primary Examiner—P. Austin Bradley
Assistant Examiner—Briggitte R. Hammond
(74) Attorney, Agent, or Firm—Finnegan, Henderson, Farabow, Garrett & Dunner, L.L.P.

(57) ABSTRACT

A card connector has a cam lever and an eject member including a cam element and lever guide ways. The eject member can move in a card insert direction relative to upper and lower housings in response to an insertion of the card. The eject member can move in a card eject direction relative to housings in response to a card eject operation. The connector further includes a press member for elastically pressing the lever so that a second end of the lever maintains to position in the guide ways. An opening is formed in the housing to allow the press member to be elastically displaced. The opening exposes only a part of the press member to an outside of the housing so that a distal end of the press member contacts with the housing.

12 Claims, 14 Drawing Sheets

U.S. PATENT DOCUMENTS

| | | | |
|---|---|---|---|
| 5,533,906 A | 7/1996 | Abe | 439/157 |
| 5,597,316 A | 1/1997 | David et al. | 439/159 |
| 5,640,307 A | 6/1997 | Bleier et al. | 361/740 |
| 5,648,651 A | 7/1997 | Inoue | 235/475 |
| 5,655,918 A | 8/1997 | Soh | 439/159 |
| 5,674,080 A | 10/1997 | Takemura | 439/159 |
| 5,695,351 A | 12/1997 | Kimura et al. | 439/159 |
| 5,703,346 A | 12/1997 | Bricaud et al. | 235/44.1 |
| 5,725,385 A | 3/1998 | Takano et al. | 439/79 |
| 5,740,012 A | 4/1998 | Choi | 439/159 |
| 5,846,096 A * | 12/1998 | Ishida | 439/159 |
| 5,871,365 A | 2/1999 | Kajiura | 439/159 |
| 5,890,920 A | 4/1999 | David et al. | 439/159 |
| 5,899,763 A | 5/1999 | Kajiura | 439/159 |
| 5,923,541 A | 7/1999 | Yasumi | 439/159 |
| 5,967,810 A | 10/1999 | Spickler et al. | 439/159 |
| 6,065,984 A | 5/2000 | Tung | 439/159 |
| 6,083,018 A | 7/2000 | Hara et al. | 439/159 |
| 6,095,834 A | 8/2000 | Lai et al. | 439/159 |
| 6,106,313 A | 8/2000 | Chen | 439/159 |
| 6,120,309 A | 9/2000 | Hara | 439/159 |
| 6,139,340 A | 10/2000 | Niitsu | 439/159 |
| 6,152,748 A | 11/2000 | Sato et al. | 439/159 |
| 6,159,027 A | 12/2000 | Kuo | 439/159 |
| 6,162,075 A | 12/2000 | Hara et al. | 439/159 |
| 6,174,197 B1 | 1/2001 | Hirata et al. | 439/159 |
| 6,200,148 B1 | 3/2001 | Yu | 439/159 |
| 6,210,187 B1 | 4/2001 | Tung | 439/159 |
| 6,227,879 B1 | 5/2001 | Dong | 439/159 |
| 6,231,360 B1 | 5/2001 | Horie | 439/159 |
| 6,234,813 B1 | 5/2001 | Hanyu | 439/159 |
| 6,270,365 B1 | 8/2001 | Nishioka | 439/159 |
| 6,273,737 B1 | 8/2001 | Furusho et al. | 439/159 |
| 6,290,136 B1 | 9/2001 | Koseki et al. | 439/159 |
| 6,299,465 B1 | 10/2001 | Hirata | 439/159 |
| 6,302,715 B1 | 10/2001 | Sato et al. | 439/159 |
| 6,319,029 B2 | 11/2001 | Nishioka | 439/159 |
| 6,332,790 B1 | 12/2001 | Ishikawa et al. | 439/159 |
| 6,390,836 B1 | 5/2002 | Motegi et al. | 439/159 |
| 6,394,827 B2 | 5/2002 | Nogami | 439/159 |
| 6,398,567 B1 | 6/2002 | Nishimura | 439/159 |
| 6,398,827 B1 | 6/2002 | Ota et al. | 51/308 |

* cited by examiner

CARD CONNECTOR

This application is based on Patent Application No. 2001-062476 filed Mar. 6, 2001 in Japan, the content of which is incorporated hereinto by reference.

BACKGROUND OF THE INVENTION

1. Field of the Invention

The present invention relates to a card connector which can be mounted on electronic devices, such as cellular phones, telephones, PDAs (personal digital assistants), portable audio devices, cameras and the like, and more particularly to a compact card connector capable of reliably locking an IC card therein.

2. Related Background Art

Known IC cards have memory and/or an IC for serving as a control circuit. By loading such an IC card into electronic apparatuses such as cellular phones, telephones, PDAs, cameras and the like, functions of these electronic apparatuses can be enhanced. Examples of such IC cards include memory cards such as Subscriber Identity Module Card (SIM card), Multi Media Card (MMC), Smart Media, Secure Digital Card (SD card), Memory Stick, and Compact Flash Card.

A card connector is built into the electronic apparatus so as to allow above IC cards to removably connect with the electronic apparatus. The card connector generally has a connector body including a card slot and a plurality of metal contact terminals. Each of contact terminals of the card connector comes to contact with a corresponding contact pad arranged on a front surface or a rear surface of the IC card when the IC card is inserted in the card slot. A contact between contact terminals of the card connector and contact pads of the IC card allows electrical connection between the electric apparatus and the IC card. That is, the contact pads of the IC card include power-source pads to be connected to a power source and a plurality of signal pads for transmitting and receiving various signals. These contact pads are respectively connected to a power source circuit or various signal processing circuits of the electronic apparatus with a plurality of contact terminals of the card connector.

Many of the card connectors mounted on these electronic devices include an eject mechanism to eject an inserted card therefrom. The conventional eject mechanisms are available in the following types.

In one type of the conventional eject mechanism, an insertion length of the card into a card slot is so determined that the rear end of the card protrudes from the card slot. When ejecting the card from the card slot, users can be held the rear end of the card with their fingers to pull out the card from the card slot.

The other type of the conventional eject mechanism includes an eject button provided near the card slot. When ejecting the card from the card slot, a user presses the eject button. By pressing the eject button, the eject mechanism is operated to eject the card from the card slot.

In the former type, however, the rear end of the card protruding from the card slot spoils the appearance of the card connector or the electronic apparatus. Moreover, this increases a chance of the card being damaged by external impacts and requires force to pull out the card from the card slot. The latter type, on the other hand, has difficulty in arranging the eject button at an appropriate position due to a space limitation and also has problems of the eject button spoiling the appearance of the card connector and hindering a size reduction.

To solve these problems, an eject mechanism of Japanese Patent Application Laid-open No. 2000-251025 has been proposed. FIG. 14 is an exploded view of the proposed mechanism. The conventional eject mechanism of FIG. 14 is so-called Push-Push (Push-in/Push-out) type card eject mechanism including a generally heart-shaped cam element 105, a cam lever 108, and the like. This eject mechanism operates to eject the card from the card slot when the inserted card is further pushed into the card slot.

As shown in FIG. 14, the conventional eject mechanism further includes an eject member 100 with a triangular projection 101 and a coil spring 103 disposed between a lower plate 102 and the eject member 100. The lower plate 102 constitutes a connector body and defines a card slot. A guide way 104 is formed on the lower plate 102 to guide the sliding movement of the eject member 100. The cam element 105 is formed on the lower plate 102. Around the cam element 105, lever guide ways 107a and 107b are formed to guide the movement of the cam lever 108. The cam lever 108 has a first end secured to the eject member 100 and a second end 108a capable of moving along the lever guide ways 107a and 107b.

When a card is inserted in the card slot defined by the lower plate 102, an cut-off corner portion of the card (not shown) abuts against the triangular projection 101 of the eject member 100. The eject member 100 is pushed by the card and is thus moved against the force of the coil spring 103 toward the interior of the card slot. At this time, the second end 108a of the cam lever 108 moves along the lever guide way 107a until it is engaged with a depressed locking surface 105a of the cam element 105. Now, the card is held immovable in the card slot with the contact pads of the card being in contact with the contact terminals of the connector.

When ejecting the card from the card slot, the user slightly pushes the inserted card inward. This disengages the cam lever 108 (second end 108a) from the locking portion 105a of the cam element 105. Then, the second end 108a of the cam lever 108 is moved along the lever guide way 107b by the restoring force of the coil spring 103. The eject member 100 therefore moves to eject the card by the card abutment portion 101 thereof.

In a card connector provided with the above described push-push type eject mechanism, an eject operation may cause a card to rush out from the card slot and to fall out of the connector (card slot). To prevent the card from falling out in this manner or falling out due to unexpected external force exerted when the card is inserted, an elastic brake (stopper) may be provided in a connector body at a predetermined location. This brake means may apply frictional force to the card in the card slot in the direction opposite to that in which the card may fall out (card eject direction).

However, it will be appreciated that the friction between the brake means and the card is not increased beyond a required level in order to allow the card to be easily removed from the connector. Accordingly, it may be difficult to reliably prevent the card from falling out of the card slot by a mechanism which includes only the brake means. Thus, the conventional card connectors still fail to prevent the card from falling out of the card slot.

On the other hand, there has been a strong demand for a decrease in the size, height, and weight of the card connector. Accordingly, the mechanism for preventing the card from falling out must be smaller and lighter.

It is an object of the present invention to solve the above described problems. The present invention provides a card connector which can reliably lock an inserted card and which can maintain the locked state even if an attempt is made to forcibly remove the card.

SUMMARY OF THE INVENTION

One aspect of the present invention relates to a card connector which can accommodate an IC card having a locking depressed portion formed in one side thereof and a plurality of contact pads arranged on a bottom surface thereof. The connector according to the present invention comprises a connector body, an eject member, a cam lever, a press member, an elastic locking piece, a locking piece displacing member, and an opening formed in the connector body.

The connector body includes a card slot for accommodating the IC card and a plurality of contact terminals adapted to respectively contact with the corresponding contact pad of the IC card. The eject member can move in a card insert direction relative to the connector body in response to an insertion of the IC card. The eject member can also move in a card eject direction relative to the connector body in response to a predetermined card eject operation to eject the IC card from the card slot. The eject member includes a generally heart-shaped cam element. One end of the cam lever is supported by the connector body, while another end of the cam lever is allowed to move along a cam profile of the cam element.

The press member is disposed inside the connector body. The press member is supported by the connector body in a cantilever manner and elastically presses the cam lever so that the another end of the cam lever maintains to contact with the cam profile of the cam element. The elastic locking piece is fixed to the eject member and has an engaging portion capable of engaging with the locking depressed portion of the IC card. Upon card insertion and ejection, the elastic locking piece cooperates with the locking piece displacing member. That is, when the eject member moves in the card eject direction, the elastic locking piece is displaced by the locking piece displacing member so that the engaging portion thereof is disengaged from the locking depressed portion of the card. Further, when the eject member moves in the card insert direction, the elastic locking piece is displaced by the locking piece displacing member so that the engaging portion thereof engages with the locking depressed portion.

If a user pulls the card to remove it from the card slot when the elastic locking piece engages with the locking depressed portion to lock the IC card in the connector body, the elastic locking piece is also pulled together with the IC card. Since the elastic locking piece is fixed to the eject member, it pulls the eject member in a direction in which the card is pulled. In this situation, the movement of the eject member is basically regulated by cam lever and the heart-shaped cam element engaging each other and the press member which elastically presses the cam lever against the cam element.

However, under this condition, if the user forcibly pull the card to remove it from the card slot, the cam lever may be disengaged from the cam element against the pressing force of the press member. In such a case, the card may be easily pulled out and in some cases, the eject mechanism may be broken.

Thus, the card connector of the present invention comprises the opening. The opening is appropriately sized to expose only a part of the press member to an outside of the connector body so that a distal end of the press member contacts with the connector body. That is, the opening allows the press member to be elastically displaced with regulating the movement of the distal end of the press member. As a result, if the cam lever likely disengages from the cam element against the pressing force of the press member, the movement of the cam lever is regulated by the connector body having enough strength. Therefore, even if the user inadvertently attempts to forcibly remove the card, the card cannot be easily removed, and the eject mechanism is reliably prevented from being broken.

In another aspect of the present invention, the generally heart-shaped cam element is formed in the connector body. Further, one end of the cam lever is supported by the eject member, while the other end the cam lever is allowed to move along the cam profile of the cam element.

The above and other objects, effects, features and advantages of the present invention will become more apparent from the following description of embodiments thereof taken in conjunction with the accompanying drawings.

DETAILED DESCRIPTION OF PREFERRED EMBODIMENTS

An embodiment of a card connector according to the present invention will be described below with reference to the accompanying drawings. This embodiment relates to a card connector for an IC card which is called "SD card".

Figure 1:
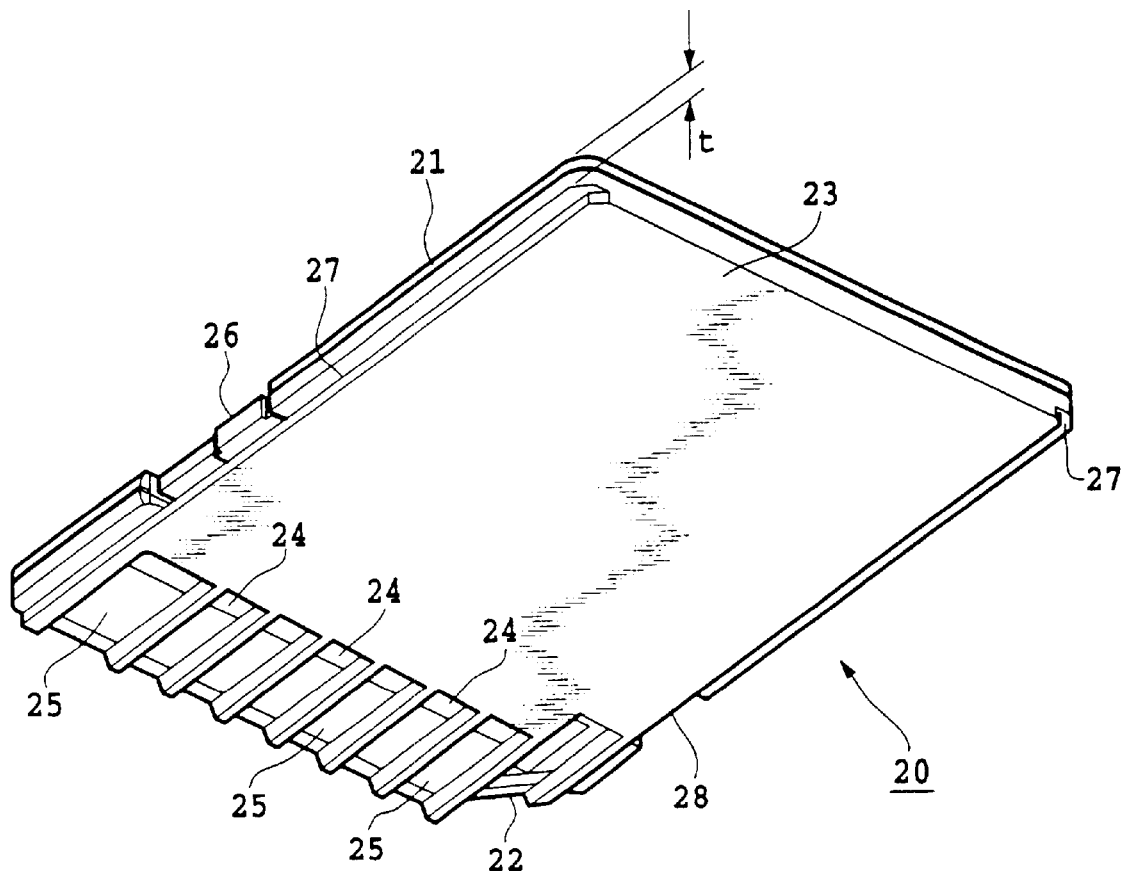
FIG. 1 is a perspective view showing an example of an IC card to be inserted into a card connector according to the present invention.
Figure 2:
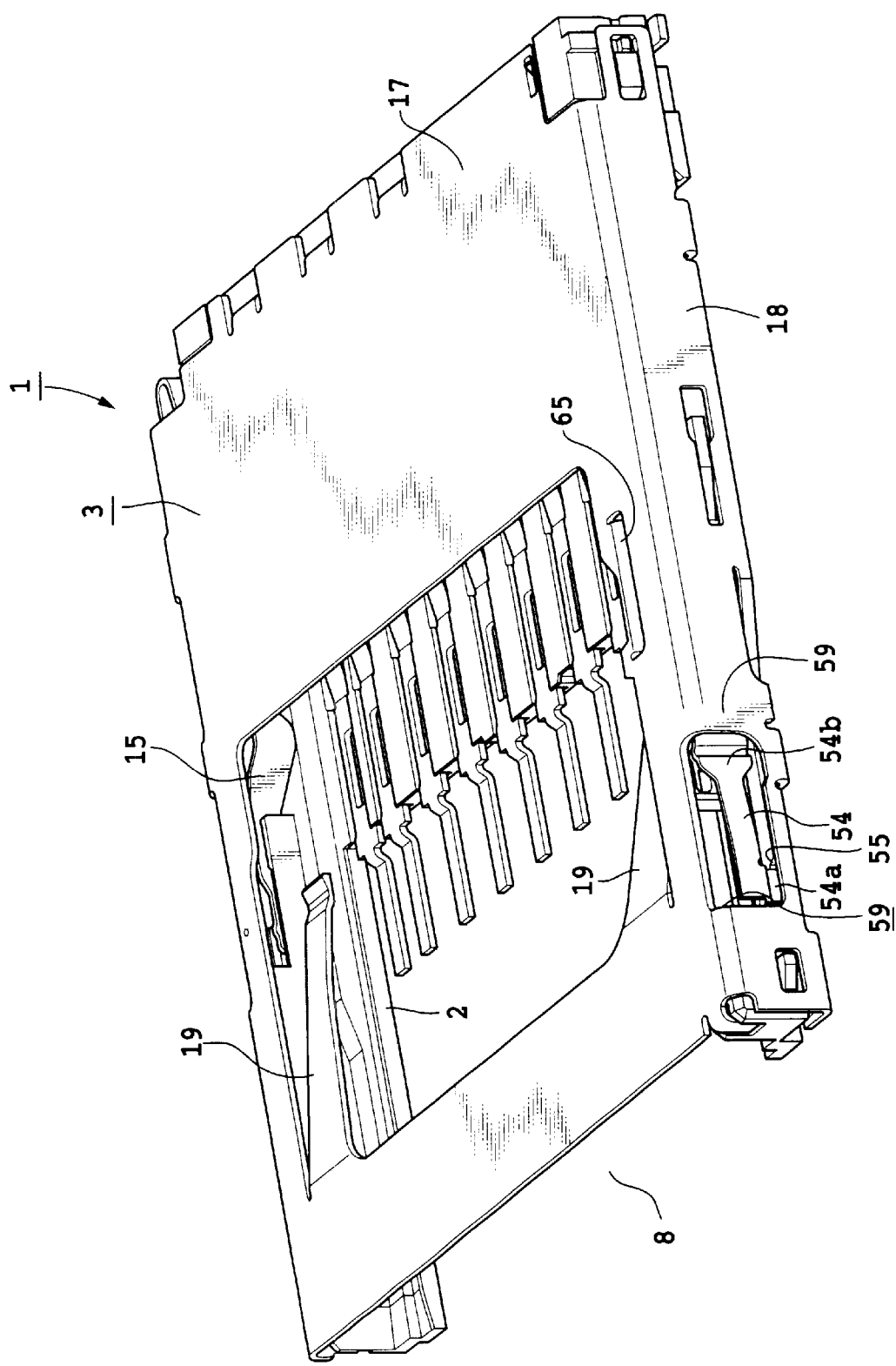
FIG. 2 is a perspective view showing the appearance of the card connector according to the present invention.

First, with reference to FIG. 1, SD card will be described. FIG. 1 shows SD card 20 as seen from a bottom thereof. The card 20 comprises an upper main body 21 with a thickness "t" and a lower main body 23. The lower main body 23 has a slightly smaller width than the upper main body 21. Thus, the card 20 has staged portions 27 which are formed at both sides of a bottom thereof and extend substantially parallel with the corresponding side edges thereof. Further, the upper main body 21 has a cut-off corner portion 22 formed in one corner thereof to insert the card into the card connector correctly.

Furthermore, the lower main body 23 has a plurality of depressed portions 24 formed at a tip portion thereof and a contact pad 25 respectively disposed in each of the depressed portions 24. Each depressed portion 24 has a depth substantially the same as the thickness of the lower main body 23. Accordingly, the surface of each contact pad 25 is spaced from the surface of the upper main body 21 by a length substantially corresponding to the thickness "t" of the upper main body 21. The card 20 includes a total of nine signal pins used for a power supply, data, commands, a clock, and the like. The card 20 also has a write protect button 26 disposed on one side thereof to prevent malfunction and a locking depressed portion 28 disposed another side thereof. The locking depressed portion 28 is used to lock the card 20 in the card connector.

Now, an embodiment of a card connector according to the present invention will be described with reference to FIGS. 2 to 12. A card connector 1 of this embodiment can be adapted to electronic devices such as cellular phones, PDAs, portable audio devices, cameras or the like. The above described card 20 is inserted into the card connector 1 with its contact pad surface facing downward. The card connector 1 includes a connector body comprising a lower housing 2 and an upper housing 3. The lower housing 2 is made of an insulated material such as a resin, while the upper housing 3 is made of a metal plate. The upper housing 3 serves as a cover member for covering the lower housing 2. By using the metal material instead of the resin, the strength of the upper housing 3 increases and the card connector 1 can be shortened.

Figure 3:
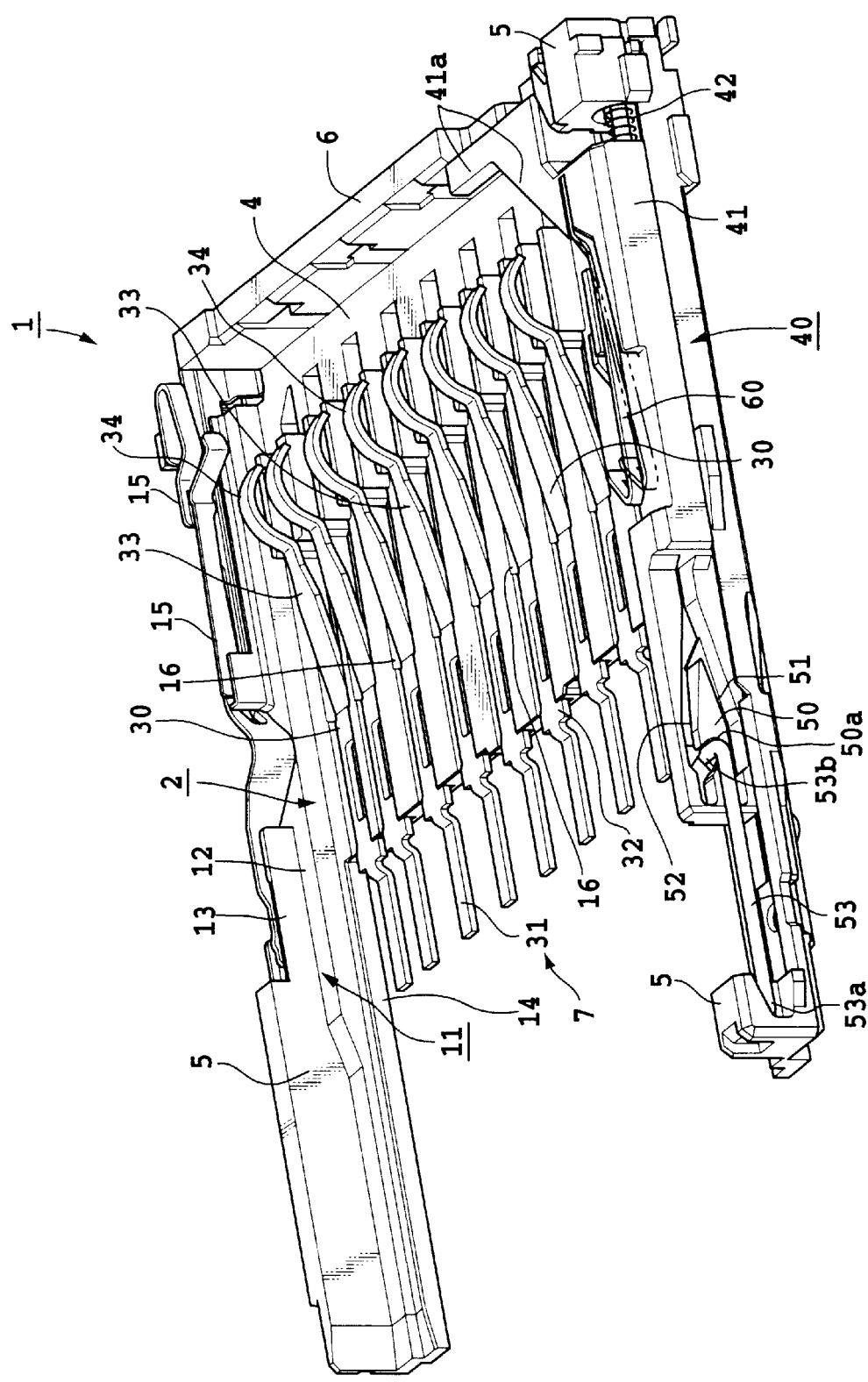
FIG. 3 is a perspective view showing an upper housing which is detached from the card connector of FIG. 2.

As shown in FIG. 3, the lower housing 2 has a bottom portion 4, a left and right side walls 5, and a rear wall 6. On the other hand, the upper housing 3 has a top plate portion 17 and a left and right side walls 18. The top plate portion 17 includes a pair of stopper 19 which prevents the card 20 from falling out when the card 20 is ejected. The lower housing 2 and the upper housing 3 are fitted together by means of protrusions formed on the side walls 5 and slots formed in the side walls 18. Thus, the top plate portion 17 of the upper housing 3 and the bottom portion 4, side walls 5, and rear wall 6 of the lower housing 2 define a card slot 7 into which the card 20 is inserted. The card 20 is inserted into the card slot 7 through a card insertion port 8 (FIG. 1).

The lower housing 2 has guide ways 11 for guiding the card 20. The guide way 11 is formed in each of side walls 5. The card 20 is inserted into or removed from the card connector 1 along the guide ways 11 with its contact pad surface facing downward (toward the lower housing 2). Each guide way 11 is defined by the top plate portion 17 of the upper housing 3, an inner surface of the side wall 5 of the lower housing 2, and a first staged portion 12 extended inward from the side wall 5. Further, a second staged portion 14 is extended inward from the first staged portion 12. The second staged portion 14 is substantially in parallel with the first staged portion 12 and has a top surface located below a top surface of the first staged portion 12. Furthermore, the lower housing 2 includes a plurality of metal spring pieces 15 disposed on one of the side walls 5. The metal spring pieces 15 are used as a write protect switch and the like for detecting the position of the write protect button 26 (FIG. 1) of the card 20.

The lower housing 2 includes a plurality of depressed portions 16 (in this case, nine) in which a contact terminal 30 is positioned and pressed in respectively. The depressed portions 16 are formed in the lower plate 4. As shown in FIG. 3, each of contact terminals 30 is a metal spring piece (contact spring) which is supported in a cantilever manner by the lower housing 2. Each contact terminal 30 has a soldered portion 31 connected to a contact pad of a printed circuit board of an electronic device, a fixed portion 32 fixed in the depressed portion 16, and a spring piece 33 capable of deforming elastically. The spring piece 33 has a contact portion 34 with an arc shape cross section at a tip portion thereof. The contact portion 34 is curved to protrude upward and can contact with the corresponding contact pad of the card 20. The contact terminals 30 are respectively pressed in the corresponding depressed portion 16 from the connector insertion port 8 toward the rear wall 6.

As shown in FIG. 3, the card connector 1 has so-called a push-push type card eject mechanism 40. That is, in the card connector 1, the card 20 inserted in the card slot 7 can be ejected by further pushing the card 20 toward the rear wall 6.

The card eject mechanism 40 includes an eject member 41, a coil spring 42, and a cam lever 53. The eject member 41 is generally L-shaped as viewed from above and includes a card abutment portion 41a abutting against the tip portion of the card 20 and the cut-off corner portion 22. The eject member 41 can slidably move along a guide way (not shown) formed in the lower housing 2. Further, the coil spring 42 is disposed between the lower housing 2 and the eject member 41.

Figure 4:
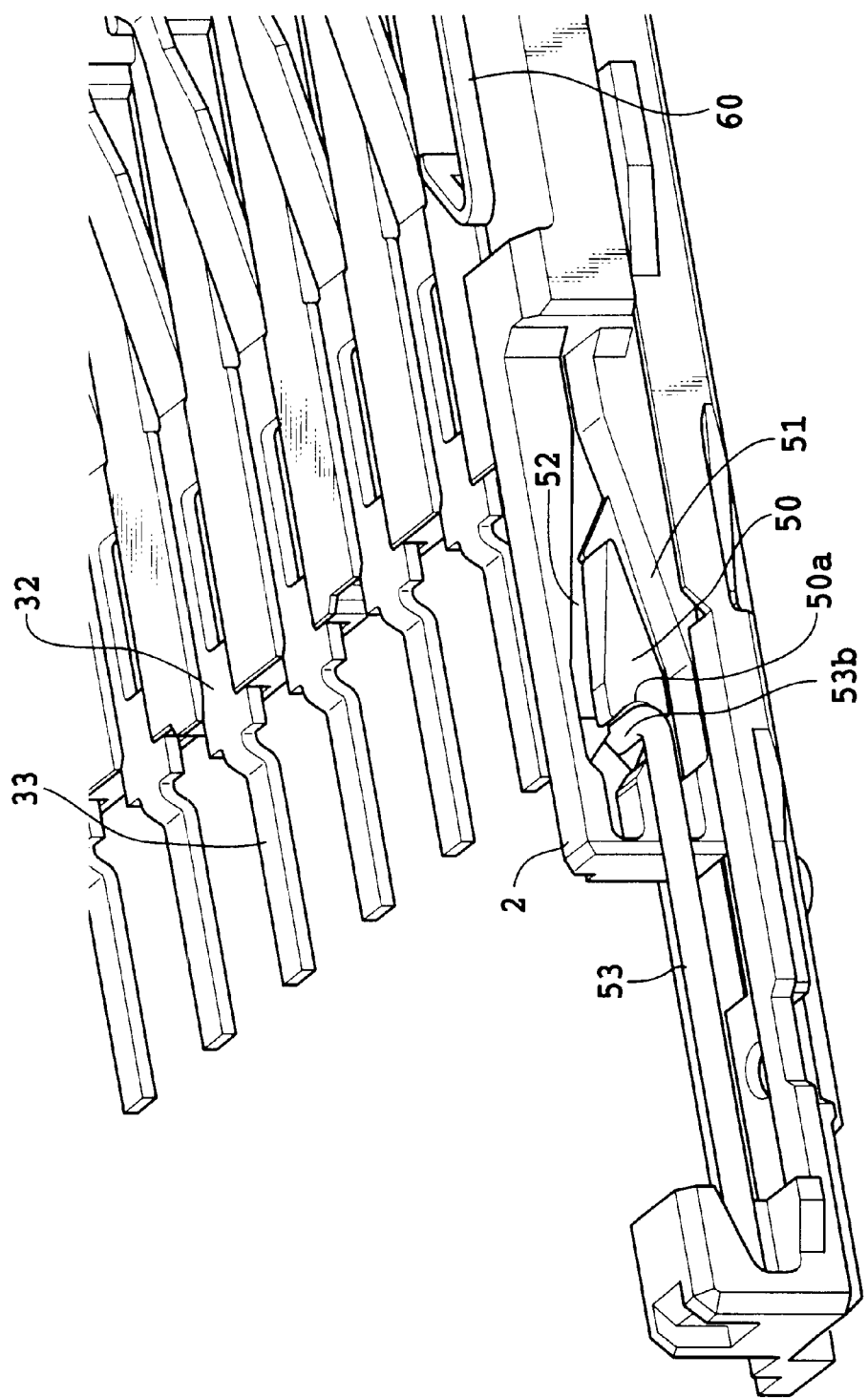
FIG. 4 is a partially enlarged perspective view of the card connector of FIG. 2.

As shown in FIG. 4, the eject member 41 includes a generally heart-shaped cam element 50 formed at an end opposite to the card abutment portion 41. The eject member 41 also includes lever guide ways 51 and 52 formed around the cam element 50. The lower guide way 51 is steeply sloped, while the upper guide way 52 is gradually sloped. Cam surfaces of the cam element 50 are formed to be opposite to the bottom portion 4 of the lower housing 2 and the top plate portion 17 of the upper housing 3. Further, the cam element 50 includes a depressed locking surface 50a (FIG. 6) formed closer to the card insertion port 8 and connecting to the cam surfaces.

The cam lever 53 is formed like a staple and disposed so that both ends thereof extend substantially in parallel with the bottom portion 4 of the housing 2 and the top plate portion 17 of the upper housing 3. A first end (one end) 53a of the cam lever 53 is inserted into a hole formed in the side wall 5 of the lower housing 2. That is, the first end 53a of the cam lever 53 is rotatably supported by the lower housing 2. A second end (another end) 53b of the cam lever 53 is initially inserted into the vicinity of the junction between the lever guide way 51 and the lever guide way 52. The second end 53b can slidably move along the guide ways 51 and 52 (cam profile of the cam element 50).

Figure 5:
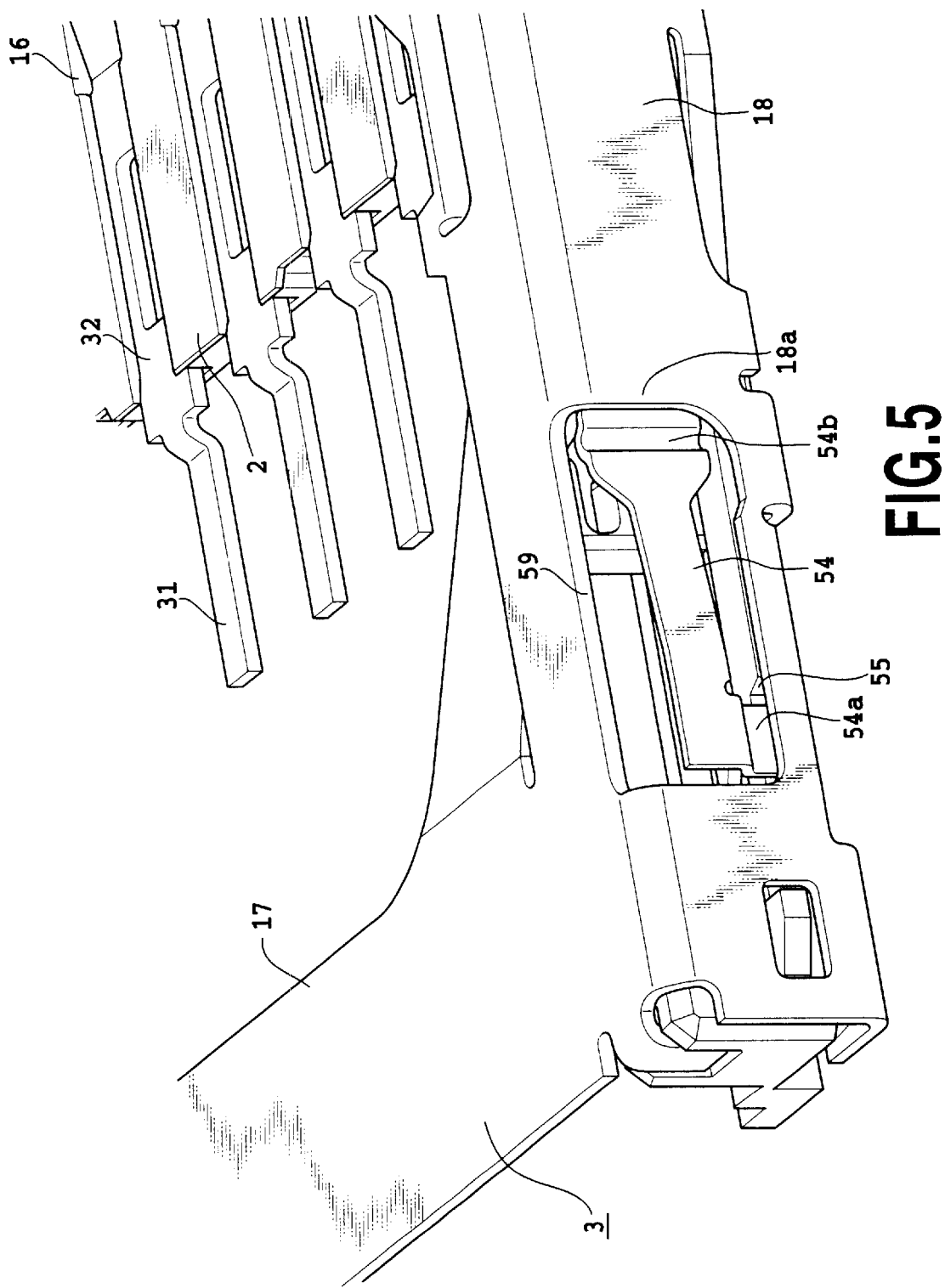
FIG. 5 is an enlarged perspective view of an essential part of the card connector of FIG. 2.
Figure 10:
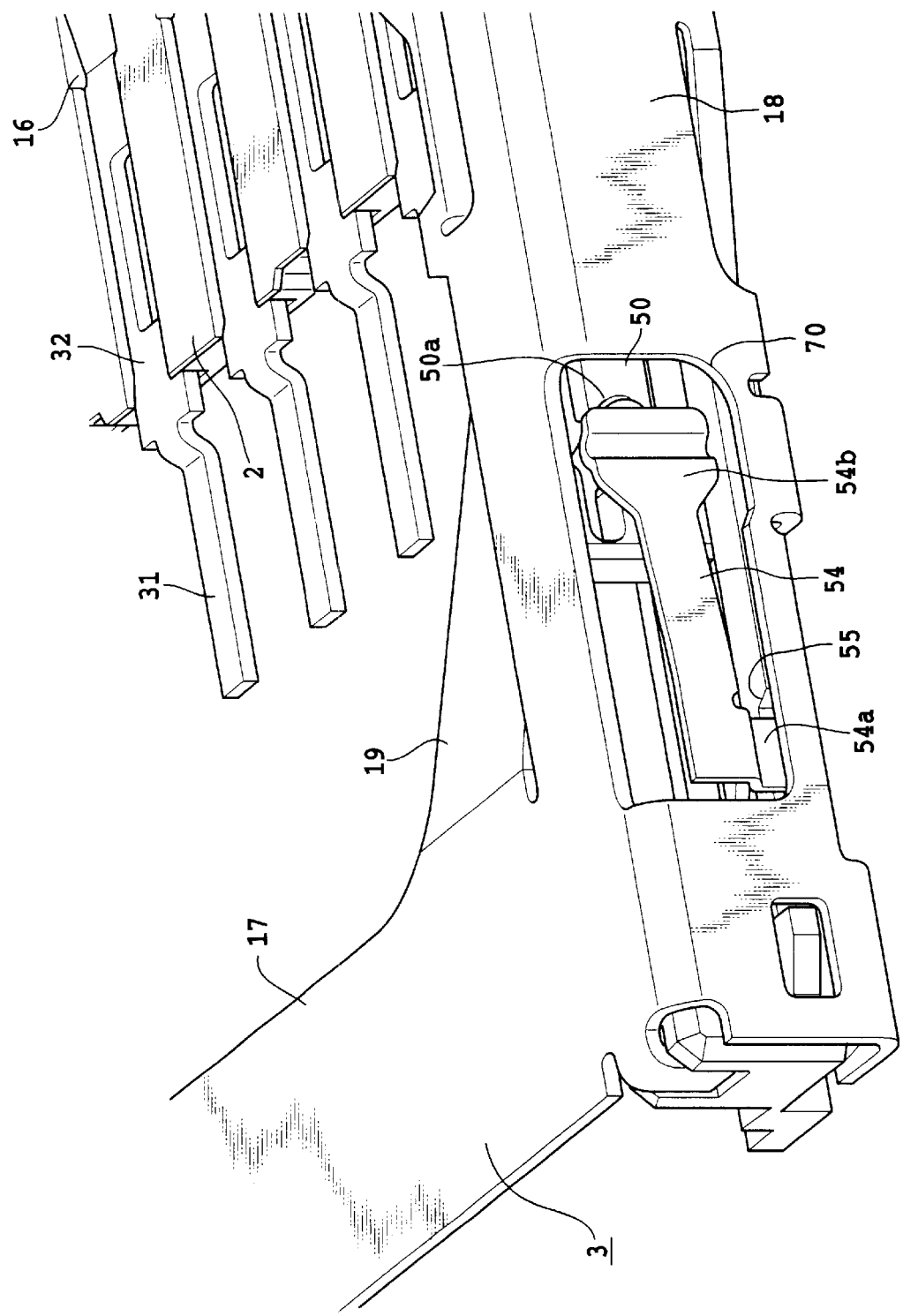
FIG. 10 is an enlarged perspective view showing a card connector comprising an opening different from that of the card connector of FIG. 2.
Figure 11:
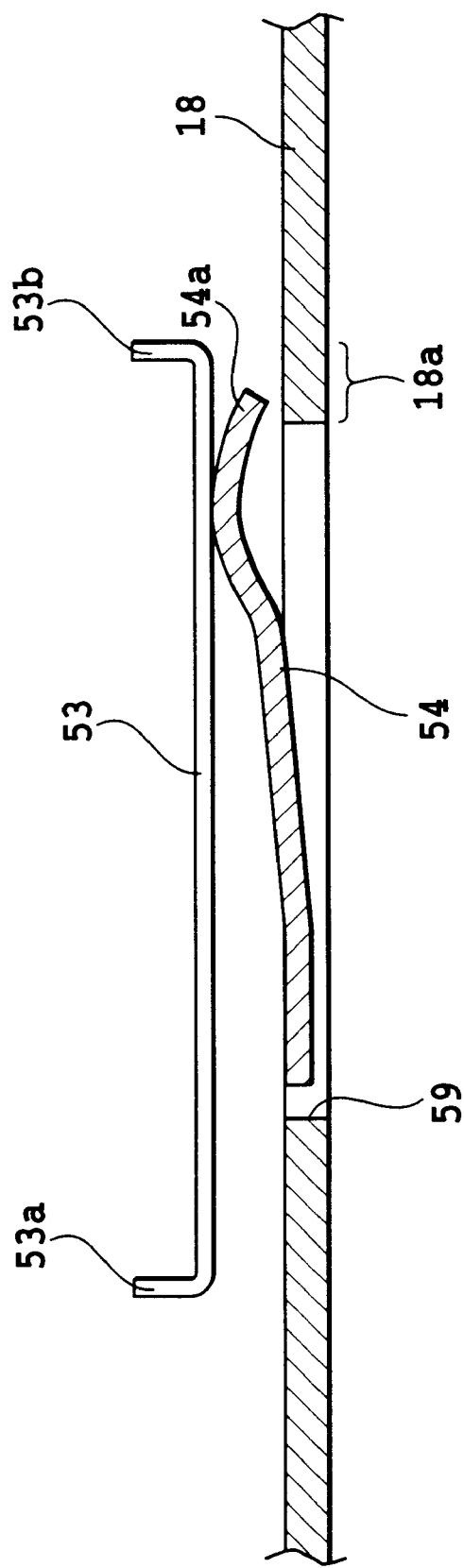
FIG. 11 is a partial sectional view showing an essential part of the card connector of FIG. 2.

The first end 53a of the cam lever 53 is simply inserted into the hole of the side wall 5. Thus, the card connector 1 has a press member 54 which is a metal spring piece and is generally L-shaped as viewed from above (FIG. 5). A proximal end portion 54a of the press member 54 is pressed in a groove 55 defined by the side surface of the lower housing 2 and the side wall 18 of the upper housing 3. Thus, the press member 54 is disposed inside the upper housing (connector body) 2 and is supported in a cantilever manner by the lower housing 2 and the upper housing 3. A tip portion 54b of the press member 54 is curved to protrude toward the cam lever 53 and has an arc shape cross section (FIG. 10).

The press member 54 (tip portion 54b) can be elastically displaced around the proximal end portion 54a. Thus, the press member 54 elastically presses the cam lever 53 so that the second end 53b of the cam lever 53 maintains to contact with the cam profile of the cam element 50, thereby preventing the second end 53b from falling out of the guide ways 51 and 52 and ensuring that the end 53b smoothly moves along guide ways 51 and 52. As described above, since the press member 54 is elastically displaced as the eject member 41 moves, an opening 59 is formed in the side wall 18 of the upper housing 3.

In the card eject mechanism 40, when the card 20 is inserted into the card slot 7, the card abutment portion 41a is pushed by the card 20 and the eject member 41 moves toward the rear wall 6 against the spring force of the coil spring 42. At the same time, the second end 53b of the cam lever 53 moves along the gradually sloped guide way 52 and subsequently engages with the locking surface 50a of the cam element 50. Accordingly, the card 20 is locked (fixed) in the card connector 1 so that the contact pads 25 of the card 20 contact with the corresponding contact terminal 30 of the card connector 1.

To eject the card 20 from the card slot 7, the inserted card 20 is slightly pushed toward the rear wall 6. As a result, the second end 53b is disengaged from the locking surface 50a of the cam element 50. Then the second end 53b of the cam lever 53 moves along the steeply sloped lever guide way 51. At the same time, the spring force of a coil spring 42 causes the eject member 41 to move toward the card insertion port 8. As a result, the card 20 is pushed by the card abutment portion 41a of the eject member 41 and thus ejected from the card slot 7.

Now, a card lock mechanism (card fall-out preventing mechanism) of the card connector 1 will be described.

Figure 7:
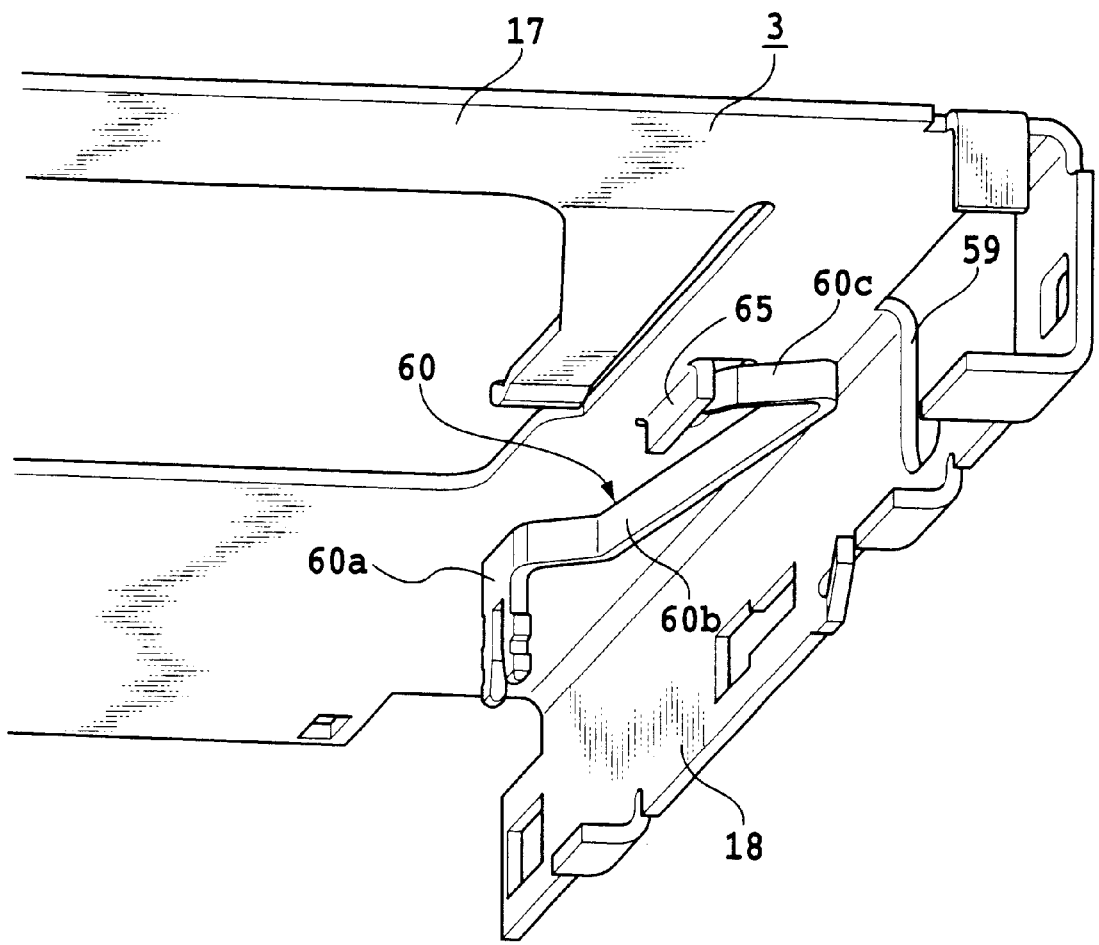
FIG. 7 is a perspective view showing an elastic locking piece which does not engage with the card.
Figure 9:
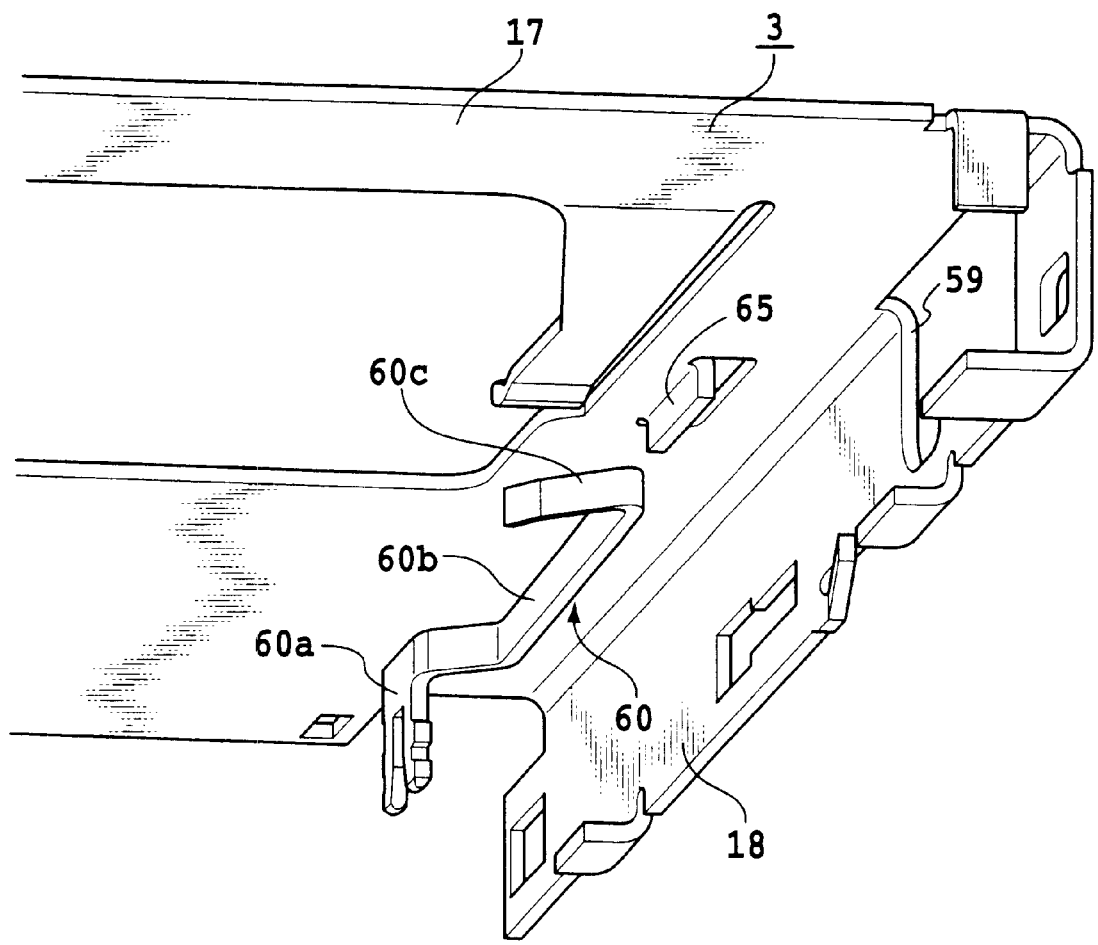
FIG. 9 is a perspective view showing the elastic locking piece which engages with the card.

As shown in FIG. 3, the card connector 1 includes an elastic locking piece 60 which is fixed to the eject member 41. The elastic locking piece 60 can be engaged with the locking depressed portion 28 to lock the card 20 in the card slot 7. The elastic locking piece 60 is made of an elastically deformable material such as a metal or resin. As shown in FIGS. 7 and 9, the elastic locking piece 60 includes a fixed portion 60a extending from the upper housing 3 toward the lower housing 2, a spring piece portion 60b extended from the fixed portion 60a toward the side wall 18 (outward) and bent in the middle thereof to extend substantially parallel with the side wall 18, and an engaging portion 60c extended from the spring piece portion 60b toward the card slot 7 and rear wall 6. The engaging portion 60c has a generally hooked shape and can be engaged with the locking depressed portion 28 of the card 20. The fixed portion 60a of the elastic locking piece 60 is inserted and fixed in a grooved portion formed in the eject member 41.

Further, the upper housing 3 has a guide piece 65 projecting toward the lower housing 2. In this embodiment, the guide piece 65 is formed by bending a part of the top plate portion 17 of the upper housing 3 in a substantial "L" shape. The guide piece 65 serves as a means for displacing the elastic locking piece 60. That is, the guide piece 65 displaces the elastic locking piece 60 so that the engaging portion 60c is disengaged from the locking depressed portion 28 of the card when the eject member 41 moves in the card eject direction. The guide piece 65 also displaces the elastic locking piece 60 so that the engaging portion 60c is engaged with the locking depressed portion 28 when the eject member 41 moves in the card insert direction.

Figure 6:
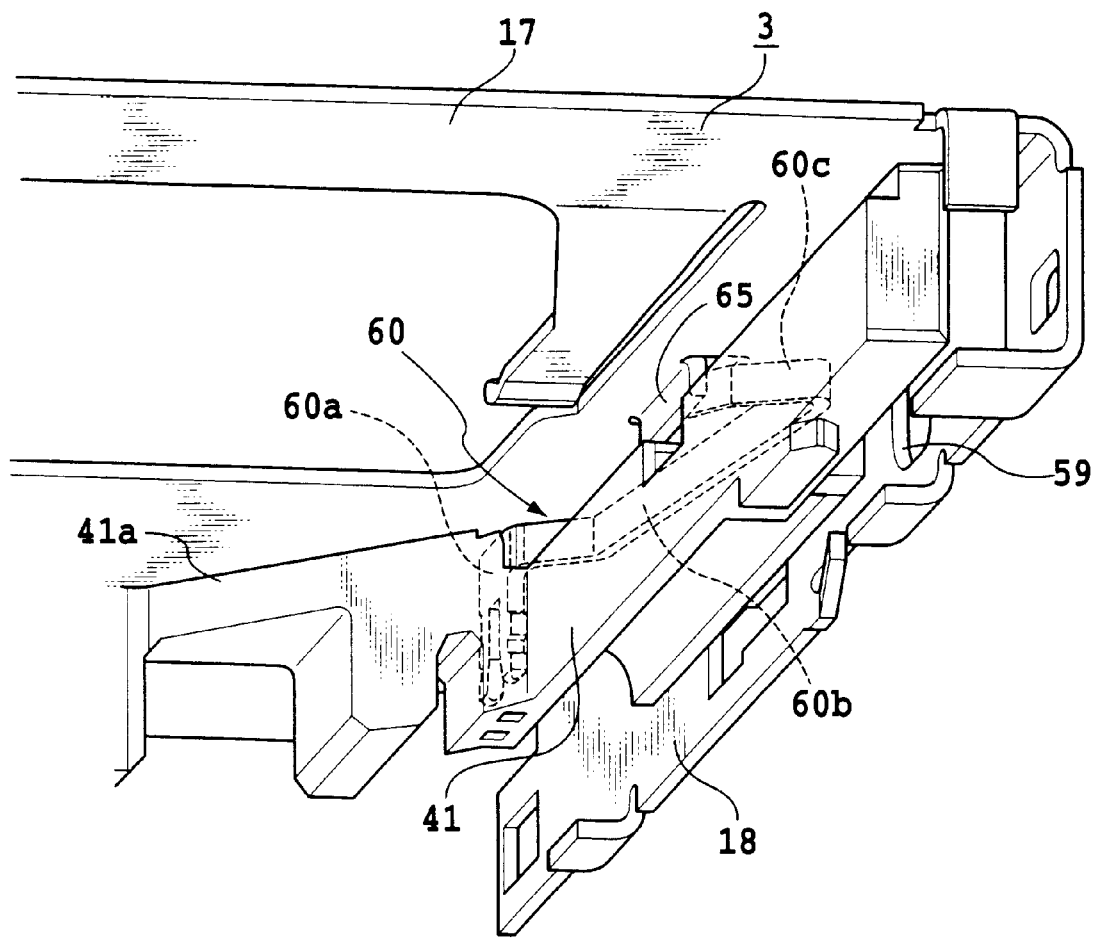
FIG. 6 is a perspective view showing an eject member in a state where the card is not locked in a card slot.

When the card 20 is not inserted into the card slot 7, the engaging portion 60c of the elastic locking piece 60 abuts against the guide piece 65 and is elastically deformed as shown in FIGS. 6 and 7. In this state, the engaging portion 60c of the elastic locking piece 60 is positioned outside the corresponding side surface of the card 20.

Figure 8:
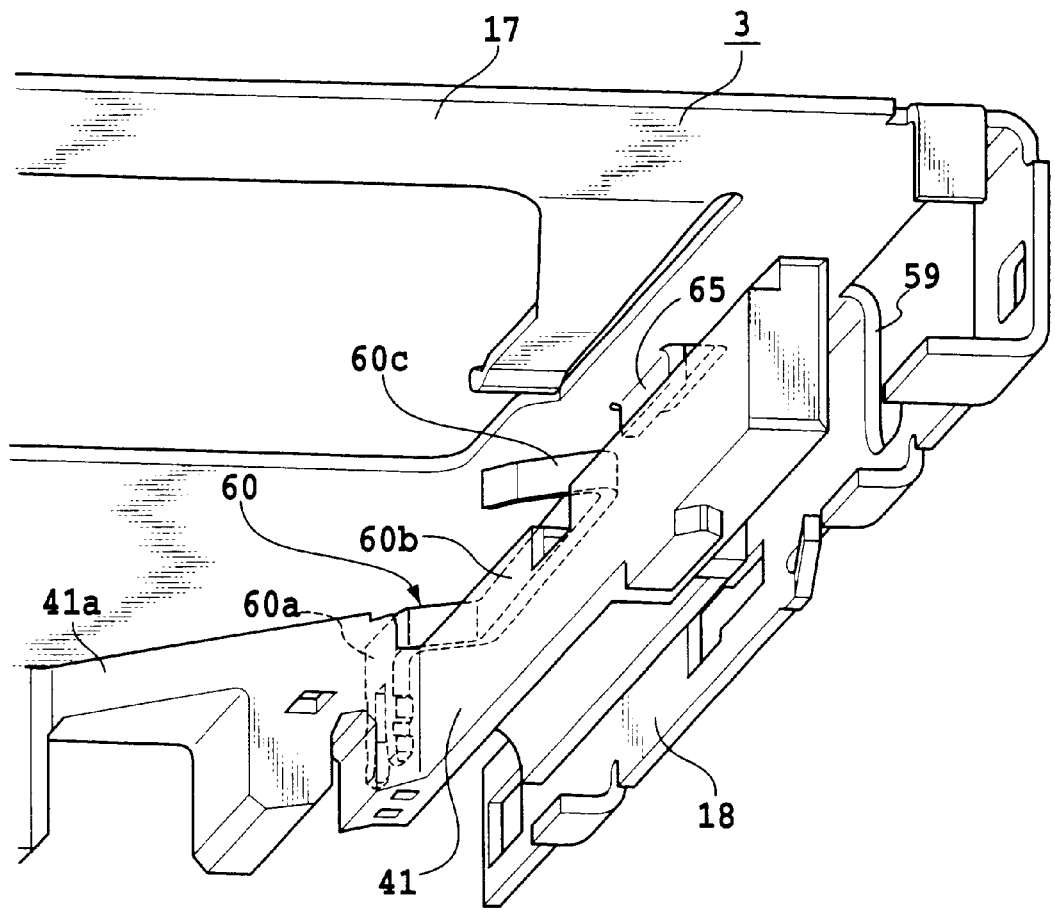
FIG. 8 is a perspective view showing the eject member in a state where the card is locked in a card slot.

In contrast, when the card 20 is inserted into the card accommodated portion 7, the eject member 41 is pushed by the card 20 and moved toward the rear wall 6 (inside of the card slot 7) as shown in FIG. 8. At the same time, as shown in FIGS. 8 and 9, the elastic locking piece 60 is moved toward the rear wall 6. This movement hinders the elastic locking piece 60 from contacting with the guide piece 65. Accordingly, the engaging portion 60c of the elastic locking piece 60 moves toward the card 20 due to the elastic restoring force of the spring piece portion 60b to fit in the locking depressed portion 28. Consequently, the card 20 is locked in the card connector 1. Therefore, the card 20 is basically prevented from falling out of the card slot 7.

If a user pulls the card 20 to remove it from the card slot 7 when the elastic locking piece 60 engages with the locking depressed portion 28 to lock the card 20 in the card slot 7, the elastic locking piece 60 is also pulled together with the card 20. Since the elastic locking piece 60 is fixed to the eject member 41, it pulls the eject member 41 in a direction in which the card 20 is pulled. In this situation, the movement of the eject member 41 is basically regulated by the cam lever 53 and the cam element 50 engaging each other and the press member 54 which elastically presses the cam lever 53 against the cam element 50. That is, the card connector 1 can hold the card 20 in the card slot 7 against force exerted by the user to pull the card 20 to some extent.

However, if the user inadvertently and forcibly pulls the card to remove it from the card slot 7, the cam lever 53 may disengage from the cam element 50 against the pressing force of the press member 54. That is, the second end 53b of the cam lever 53 may slip out from the lever guide ways 51 or 52 and climb over the cam element 50. In such a case, the card 20 may be easily pulled out and in some cases, the eject mechanism 40 may be broken.

To solve these problems, the card connector 1 of the present invention comprises the opening 59 formed in the side wall 18 of the upper housing 3. The opening 59 is appropriately sized to expose only a part of the press member 54 to the outside of the upper housing 3 so that a distal end of the press member 54 contacts with a portion 18a of the side wall 18.

That is, the opening 59 allows the press member 54 to be elastically displaced. On the other hand, the distal end of the tip portion 54b (press member 54) abuts against the back surface of a portion 18a of the side wall 18. As a result, if the second end 53b of the cam lever 53 likely disengages from the lever guide ways 51 or 52 against the pressing force of the press member 54, the movement of the cam lever 53 is regulated by the upper housing 3 having enough strength. Therefore, even if the user inadvertently attempts to forcibly remove the card 20, the card 20 cannot be easily removed, and the eject mechanism 40 is reliably prevented from being broken. In contrast to this, if the opening exposes substantially the entire press member 54 (particularly tip portion 54b) to the outside of the upper housing 3 as an opening 70 of FIG. 10, it may be difficult to reliably hold the end 53b of the cam lever 53 in the lever guide ways 51 and 52.

In the example shown in FIG. 5, a part of proximal end portion 54a of the press member 54 is exposed through the opening 59, but the present invention is not limited to this. The opening 59 may be sized to hinder the proximal end portion 54a of the press member 54 from being exposed.

Figure 12:
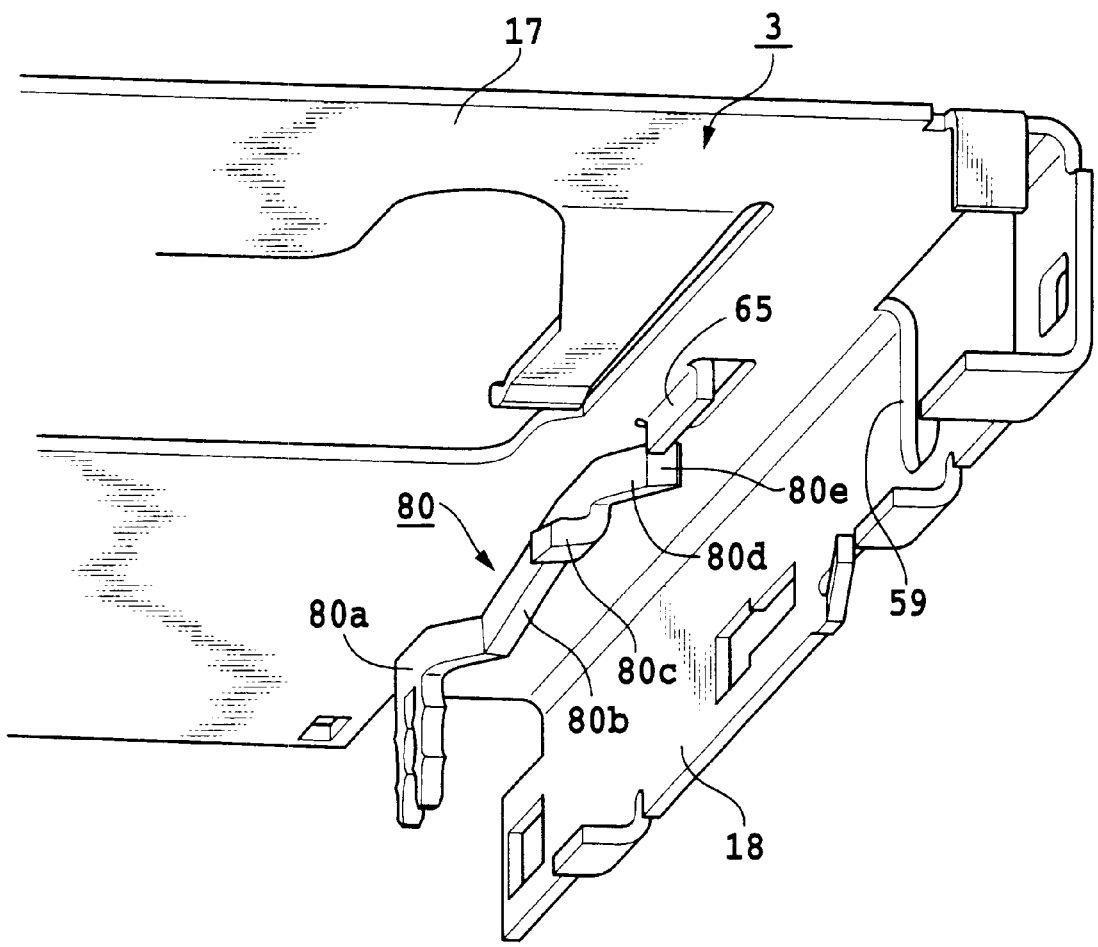
FIG. 12 is a perspective view showing another embodiment of the elastic locking piece in a state where the card is locked in a card slot.
Figure 13:
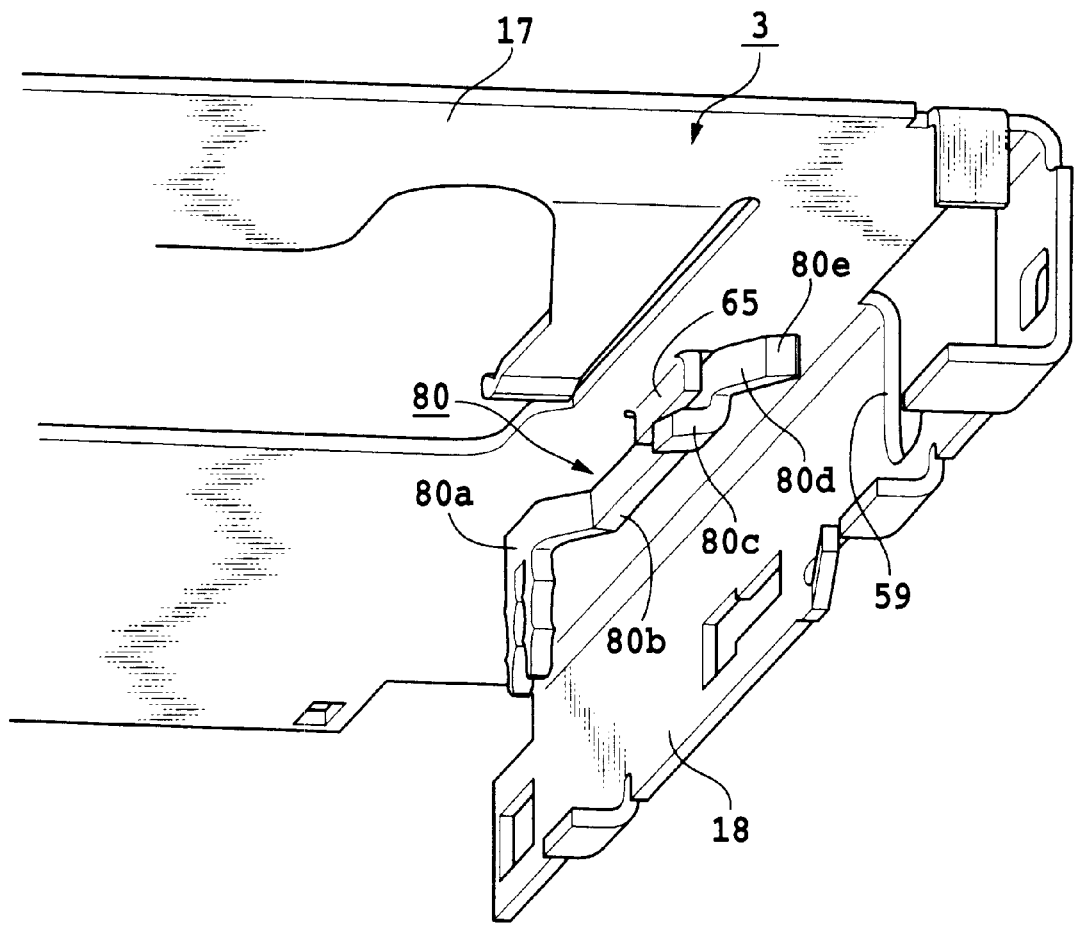
FIG. 13 is a view showing another embodiment of the elastic locking piece in a state where the card is not locked in a card slot.
Figure 14:
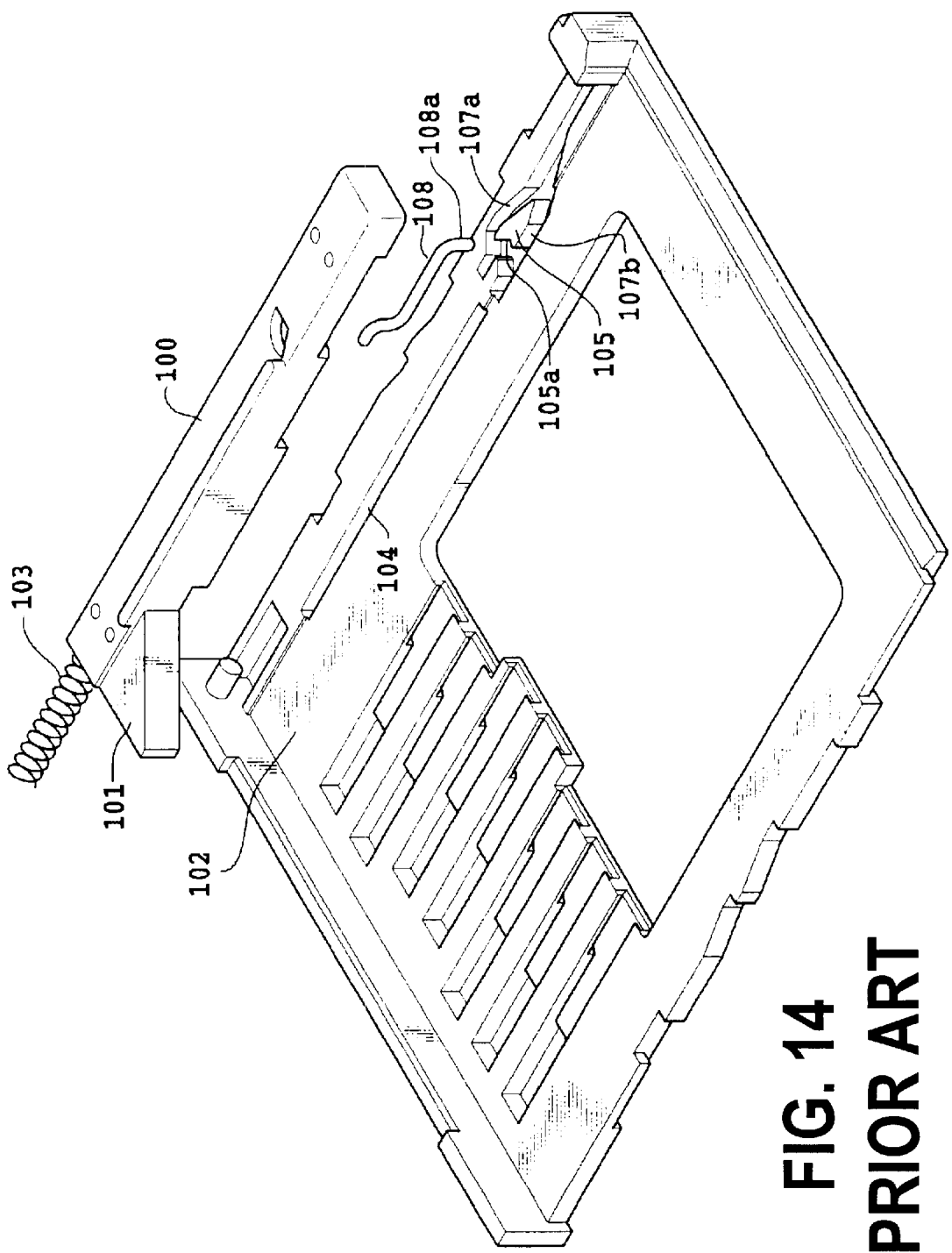
FIG. 14 is a perspective view showing a part of a conventional card connector.

FIGS. 12 and 13 show another embodiment of the card lock mechanism.

An elastic locking piece 80 shown in FIGS. 12 and 13 includes a fixed portion 80a fixed to the eject member 41, a spring piece portion 80b, and a hook-shaped engaging portion 80c, as well as a tip portion 80d. The tip portion 80d of the elastic locking piece 80 is bent outward and has a tapered surface at a tip thereof to reliably contact with a guide piece 65 protruding from the top plate portion 17 of the upper housing 3 toward the lower housing 2.

As the eject member 41 moves, the tip portion 80d of the elastic locking piece 80 comes into contact with the guide piece 65 so that the elastic locking piece 80 is elastically displaced to separate from the corresponding side of the card 20. Therefore, the engaging portion 80c of the elastic locking piece 80 can be disengaged from and engaged with the locking depressed portion 28 of the card 20. In the embodiment of FIGS. 12 and 13, the upper housing 3 also has the opening 59 formed in the side wall 18 to expose only a part of the press member 54 to the outside in order to regulate the displacement of the distal end of the press member 54.

As has described above, the cam element 50 is disposed in the eject member 41 and the first end 53a of the cam lever 53 is supported by the lower housing 2, but the present invention is not limited to this. The present invention may be applicable to a card connector in which the connector body includes the cam element and the end of the cam lever 53 serving as a fulcrum for rotational movement is supported by the eject member.

Further, in the above embodiments, the cam element 50, the cam lever 53 and the press member 54 are arranged in the side portion of the card connector, but the present invention is not limited to this aspect. The cam element 50, the cam lever 53, and the press member 54 may be arranged on the upper or bottom portion of the connector body.

Furthermore, the eject mechanism of the above embodiments is only an exemplification. The present invention may be applicable to a card connector in which the card is ejected by operating an eject button.

In an alternative card lock mechanism, for example, the elastic locking piece has an appropriate protrusion and the connector body has a tapered surface. The protrusion slidably moves on the tapered surface of the connector body so that the elastic locking piece approach or leave the locking depressed portion of the card. In another alternative card lock mechanism, the elastic locking piece may be elastically moved to approach or leave a bottom or top surface of a card on which a locking depressed portion is formed.

Furthermore, in the above embodiment, SD card is exemplified as the IC card 20, but the present invention is not limited to this. The card connector of the present invention can be adapted to the other types of cards having a locking depressed portion formed therein and a plurality of contact pads arranged thereon. The connector body of the present invention may have an optional size, optional components, and the like.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes and modifications as fall within the true spirit of the invention.

What is claimed is:

1. A card connector capable of accommodating an IC card having a locking depressed portion formed in one side thereof and a plurality of contact pads arranged on a bottom surface thereof, said card connector comprising:
   a connector body including a card slot for accommodating said IC card and a plurality of contact terminals adapted to respectively contact with said corresponding contact pad of said IC card;
   an eject member including a generally heart-shaped cam element, said eject member movable in a card insert direction relative to said connector body in response to an insertion of said IC card and movable in a card eject direction relative to said connector body in response to a predetermined card eject operation to eject said IC card from said card slot;
   a cam lever having one end and another end, said one end supported by said connector body and said another end capable of moving along a cam profile of said cam element;
   a press member disposed inside said connector body, said press member supported by said connector body in a cantilever manner and elastically pressing said cam lever so that said another end of said cam lever maintains to contact with said cam profile of said cam element;
   an elastic locking piece fixed to said eject member and having an engaging portion capable of engaging with said locking depressed portion of said IC card;
   a locking piece displacing member capable of displacing said elastic locking piece so that said engaging portion is disengaged from said locking depressed portion when said eject member moves in said card eject direction and capable of displacing said elastic locking piece so that said engaging portion is engaged with said locking depressed portion when said eject member moves in said card insert direction;
   an opening formed in said connector body to allow said press member to be elastically displaced, said opening exposing only a part of said press member to an outside of said connector body so that a distal end of said press member contacts with said connector body.

2. A card connector according to claim 1, wherein said IC card in said card slot is further pushed into said card slot by said predetermined card eject operation.

3. A card connector according to claim 1, wherein said opening is formed in a side wall of said connector body.

4. A card connector according to claim 1, wherein said connector body comprises an upper housing and a lower housing separate from said upper housing, and
   wherein said opening is formed in said upper housing.

5. A card connector according to claim 1, further comprising an elastic member arranged between said eject member and said connector body to bias said eject member in said card eject direction.

6. A card connector according to claim 1, wherein said engaging portion of said elastic locking piece has a generally hooked shape.

7. A card connector capable of accommodating an IC card having a locking depressed portion formed in one side thereof and a plurality of contact pads arranged on a bottom surface thereof, said card connector comprising:
   a connector body including a card slot for accommodating said IC card, a plurality of contact terminals adapted to respectively contact with said corresponding contact pad of said IC card and a generally heart-shaped cam element, an eject member movable in a card insert direction relative to said connector body in response to an insertion of said IC card and movable in a card eject direction relative to said connector body in response to a predetermined card eject operation to eject said IC card from said card slot;

a cam lever having one end and another end, said one end supported by said eject member and said another end capable of moving along a cam profile of said cam element;

a press member disposed inside said connector body, said press member supported by said connector body in a cantilever manner and elastically pressing said cam lever so that said another end of said cam lever maintains to contact with said cam profile of said cam element;

an elastic locking piece fixed to said eject member and having an engaging portion capable of engaging with said locking depressed portion of said IC card;

a locking piece displacing member capable of displacing said elastic locking piece so that said engaging portion is disengaged from said locking depressed portion when said eject member moves in said card eject direction and capable of displacing said elastic locking piece so that said engaging portion is engaged with said locking depressed portion when said eject member moves in said card insert direction;

an opening formed in said connector body to allow said press member to be elastically displaced, said opening exposing only a part of said press member to an outside of said connector body so that a distal end of said press member contacts with said connector body.

8. A card connector according to claim 7, wherein said IC card in said card slot is further pushed into said card slot by said predetermined card eject operation.

9. A card connector according to claim 7, wherein said opening is formed in a side wall of said connector body.

10. A card connector according to claim 7, wherein said connector body comprises an upper housing and a lower housing separate from said upper housing, and wherein said opening is formed in said upper housing.

11. A card connector according to claim 7, further comprising an elastic member arranged between said eject member and said connector body to bias said eject member in said card eject direction.

12. A card connector according to claim 7, wherein said engaging portion of said elastic locking piece has a generally hooked shape.

* * * * *